US008134512B1

(12) United States Patent
Chen et al.

(10) Patent No.: US 8,134,512 B1
(45) Date of Patent: Mar. 13, 2012

(54) ANTENNA PEAK STRENGTH FINDER

(75) Inventors: Ernest C. Chen, San Pedro, CA (US); Gustave R. Stroes, Beverly Hills, CA (US); Yang-Yang Shi, San Diego, CA (US); Guangcai Zhou, Agoura Hills, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 463 days.

(21) Appl. No.: 12/269,811

(22) Filed: Nov. 12, 2008

(51) Int. Cl.
*H01Q 3/00* (2006.01)
*G01R 29/08* (2006.01)

(52) U.S. Cl. ............ 343/757; 37/703; 37/894; 342/359; 725/72

(58) Field of Classification Search .................. 343/757, 343/894, 702; 725/72; 342/359
See application file for complete search history.

(56) References Cited

U.S. PATENT DOCUMENTS

| | | | | |
|---|---|---|---|---|
| 5,043,737 | A * | 8/1991 | Dell-Imagine | 342/358 |
| 6,473,035 | B2 * | 10/2002 | Fang | 342/359 |
| 6,507,325 | B2 * | 1/2003 | Matz et al. | 343/878 |
| 6,563,471 | B2 * | 5/2003 | Spirtus | 343/757 |
| 7,636,067 | B2 | 12/2009 | Norin | |
| 2005/0135815 | A1 | 6/2005 | Gerwe et al. | |
| 2007/0072545 | A1 | 3/2007 | Karabinis et al. | |

OTHER PUBLICATIONS

Nishiguchi, K.; Tsuchiya, K.; , "Optimization of Coverage Pattern for Regional Communications Satellite," Aerospace and Electronic Systems, IEEE Transactions on, vol. AES-18, No. 5, pp. 642-647, Sep. 1982.*

'signal-strength meter' 1992, in Academic Press Dictionary of Science and Technology, Elsevier Science & Technology, Oxford, United Kingdom, viewed Jan. 14, 2011, from http://www.credoreference.com/entry/apdst/signal_strength_meter&gt.*

Nishiguchi, K.; Tsuchiya, K.;, "Optimization of Coverage Pattern for Regional Communications Satellite," Aerospace and Electronic Ssystems, IEEE Transactions on, vol. AES-18, No. 5, pp. 642-647, Sep. 1982.*

Non-final Office action dated Feb. 4, 2011 in U.S. Appl. No. 12/269,807, filed Nov. 12, 2008 by Romulo Pontual et al.

* cited by examiner

*Primary Examiner* — Jacob Y Choi
*Assistant Examiner* — Amal Patel

(57) ABSTRACT

Methods, apparatuses and systems for aligning an antenna reflector with satellites in a satellite configuration. A method in accordance with one or more embodiments of the present invention comprises aligning the reflector in tilt based on a geographic location of the reflector, passing the reflector through an azimuth arc wherein the azimuth arc intercepts at least a first point and a second point, the first point having a first signal strength received from the satellite configuration on the azimuth arc and the second point having a second signal strength less than the first signal strength, the second point located on the azimuth arc after the first point, passing the reflector through an elevation arc, the elevation arc intercepting at least the second point and a third point, the third point having a third signal strength received from the satellite configuration on the elevation arc, determining an alignment point having a maximum signal strength received from the satellite configuration based on a Gaussian antenna pattern of a reception of the satellite signal and the first signal strength, the second signal strength, and the third signal strength, and aligning the reflector with the alignment point.

10 Claims, 7 Drawing Sheets

ANTENNA PEAK STRENGTH FINDER

BACKGROUND OF THE INVENTION

1. Field of the Invention

The present invention relates generally to a satellite receiver system, and in particular, to finding the peak alignment for an antenna being used in a multi-satellite direct broadcast system.

2. Description of the Related Art

Satellite broadcasting of communications signals has become commonplace. Satellite antenna pattern of commercial signals for use in television programming currently utilizes multiple feedhorns on a single Outdoor Unit (ODU) which supply signals to up to eight Integrated Receiver/Decoders (IRDs) on separate cables from a multiswitch.

Typically, an antenna is pointed toward the southern sky, and roughly aligned with the satellite downlink beam, and then fine-tuned using a power meter or other alignment tools. The precision of such an alignment is usually not critical. However, additional satellites that operate at higher downlink frequencies are now deployed that require more exacting alignment methods, and, without exacting alignment of the antenna dish, the signals from the additional satellites will not be properly received, rendering these signals useless for data and video transmission. It can be seen, then, that there is a need in the art for an alignment method for a satellite broadcast system that can be expanded to include new satellites and new transmission frequencies.

SUMMARY OF THE INVENTION

To minimize the limitations in the prior art, and to minimize other limitations that will become apparent upon reading and understanding the present specification, the present invention discloses one or more embodiments of methods, apparatuses, and systems for aligning an antenna reflector with satellites in a satellite configuration.

A method for aligning a reflector of an antenna with a satellite configuration in accordance with one or more embodiments of the present invention comprises aligning the reflector in tilt based on a geographic location of the reflector, passing the reflector through an azimuth arc wherein the azimuth arc intercepts at least a first point and a second point, the first point having a first signal strength received from the satellite configuration on the azimuth arc and the second point having a second signal strength less than the first signal strength, the second point located on the azimuth arc after the first point, passing the reflector through an elevation arc, the elevation arc intercepting at least the second point and a third point, the third point having a third signal strength received from the satellite configuration on the elevation arc, determining an alignment point having a maximum signal strength received from the satellite configuration based on a Gaussian antenna pattern of a reception of the satellite signal and the first signal strength, the second signal strength, and the third signal strength, and aligning the reflector with the alignment point.

Such a method may further optionally comprise performing a coarse alignment, verifying the reflector is aligned with the alignment point, determining the alignment point being performed by a signal strength meter, determining the alignment point being done by a receiver, the transmission being determined from a plurality of orbital slots, and the first signal strength, the second signal strength, and the third signal strength are measured using a time-average to counteract scintillation.

An alignment system in accordance with one or more embodiments of the present invention comprises an antenna having a reflector, and a meter, the meter being coupled to the antenna, wherein the reflector is aligned in tilt based on a geographic location of the reflector, and the meter provides indications of signal strengths of at least a first point and a second point lying on an azimuth arc of the reflector and the second point and a third point lying on an elevation arc of the reflector, wherein an alignment point is determined by the meter based on a Gaussian antenna pattern of a reception of a satellite signal and the signal strengths measured at the first point, the second point, and the third point.

Such an alignment system may further optionally comprise the reflector being coarsely aligned prior to the measurements made at the first point, aligning the reflector with the alignment point, the meter being integrated with a receiver, the alignment point being determined by the meter and a separate receiver, the transmission being determined from a plurality of orbital slots, and the signal strengths being measured using a time-average to counteract scintillation.

A meter in accordance with one or more embodiments of the present invention is used in aligning a reflector in a satellite-based communications system, and comprises a memory, a processor, coupled to the memory, and an indicator, coupled to the processor, wherein the memory stores a plurality of signal strengths from at least a first point, a second point, and a third point, the first point having a first signal strength received from the satellite-based communications system along an azimuth arc of the reflector, the second point located on the azimuth arc after the first point, the third point having a third signal strength received from the satellite-based communications system along an elevation arc of the reflector, wherein the meter determines an alignment point having a maximum signal strength received from the satellite-based communications system based on a Gaussian antenna pattern of a reception of the satellite signal and the first signal strength, the second signal strength, and the third signal strength.

Other features and advantages are inherent in the system and method claimed and disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

Figure 1:
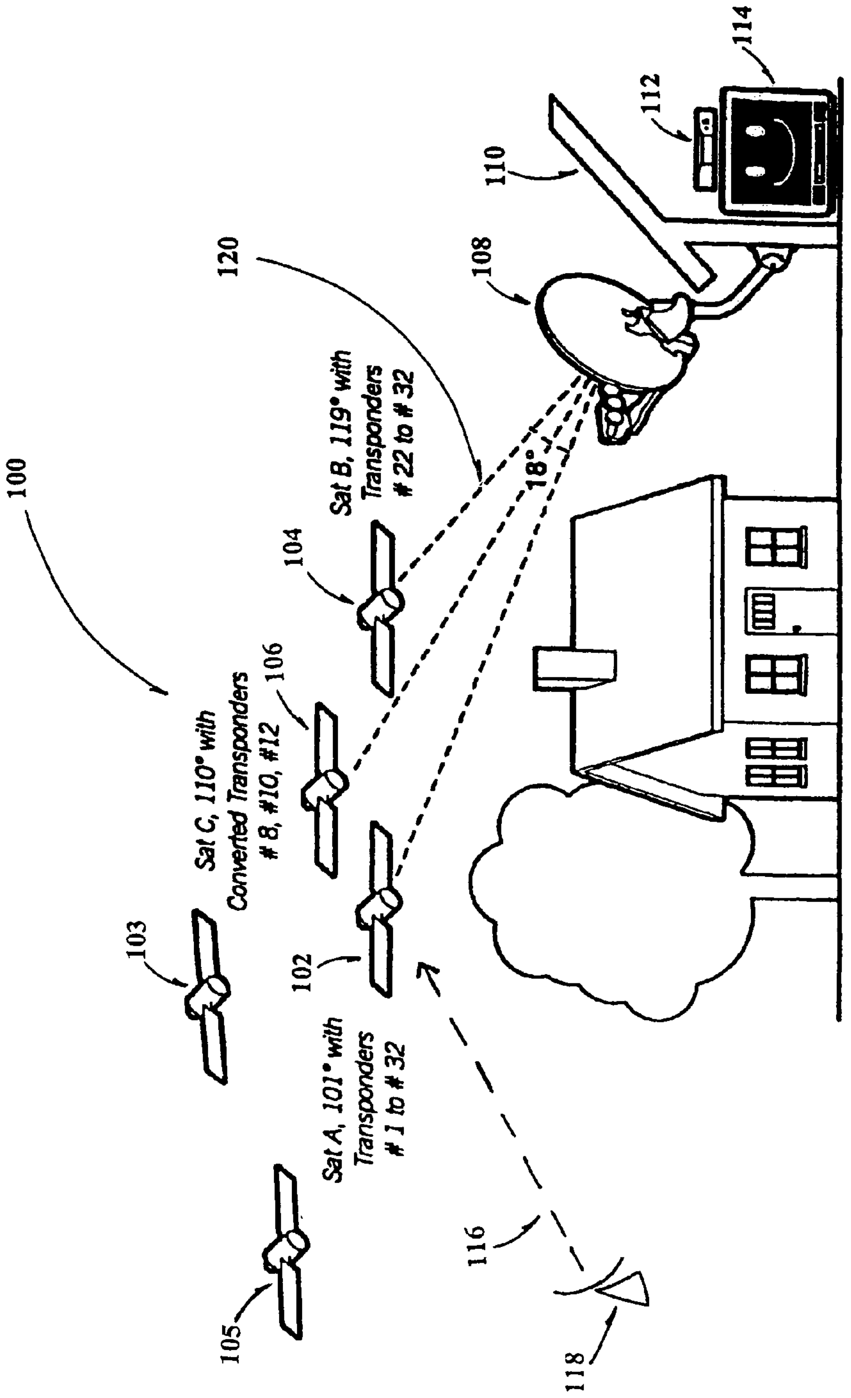
FIG. 1 illustrates a satellite constellation in accordance with one or more embodiments of the present invention.

FIG. 1 illustrates a satellite constellation in accordance with one or more embodiments of the present invention.

System 100 uses signals sent from Satellite A (SatA) 102, Satellite B (SatB) 104, and Satellite C (SatC) 106 (with transponders 28, 30, and 32 converted to transponders 8, 10, and 12, respectively), that are directly broadcast to an Outdoor Unit (ODU) 108 that is typically attached to the outside of a house 110. ODU 108 receives these signals and sends the received signals to IRD 112, which decodes the signals and separates the signals into viewer channels, which are then passed to television 114 for viewing by a user. There can be more than one satellite transmitting from each orbital location.

Satellite uplink signals 116 are transmitted by one or more uplink facilities 118 to the satellites 102-106 that are typically in geosynchronous orbit. Satellites 102-106 amplify and rebroadcast the uplink signals 116, through transponders located on the satellite, as downlink signals 120. Depending on the satellite 102-106 antenna pattern, the downlink signals 120 are directed towards geographic areas for reception by the ODU 108.

The orbital locations of satellites 102-106 are fixed by regulation, so, for example, there is a satellite at 101 degrees West Longitude (WL), SatA 102; another satellite at 110 degrees WL, SatC 106; and another satellite at 119 degrees WL, SatB 104. Satellite 103 is located at 102.8 degrees WL, and satellite 105 is located at 99.2 degrees WL. Other satellites may be at other orbital slots, e.g., 72.5 degrees, 95 degrees, without departing from the scope of the present invention. The satellites are typically referred to by their orbital location, e.g., SatA 102, the satellite at 101 WL, is typically referred to as "101."

Satellites 102, 104, and 106 broadcasts downlink signals 120 in typically thirty-two (32) different frequencies, which are licensed to various users for broadcasting of programming, which can be audio, video, or data signals, or any combination. These signals are typically located in the Ku-band of frequencies, i.e., 11-18 GHz. Satellites 103 and 105 typically broadcast in the Ka-band of frequencies, i.e., 18-40 GHz, but typically 18-30 GHz.

Figure 2:
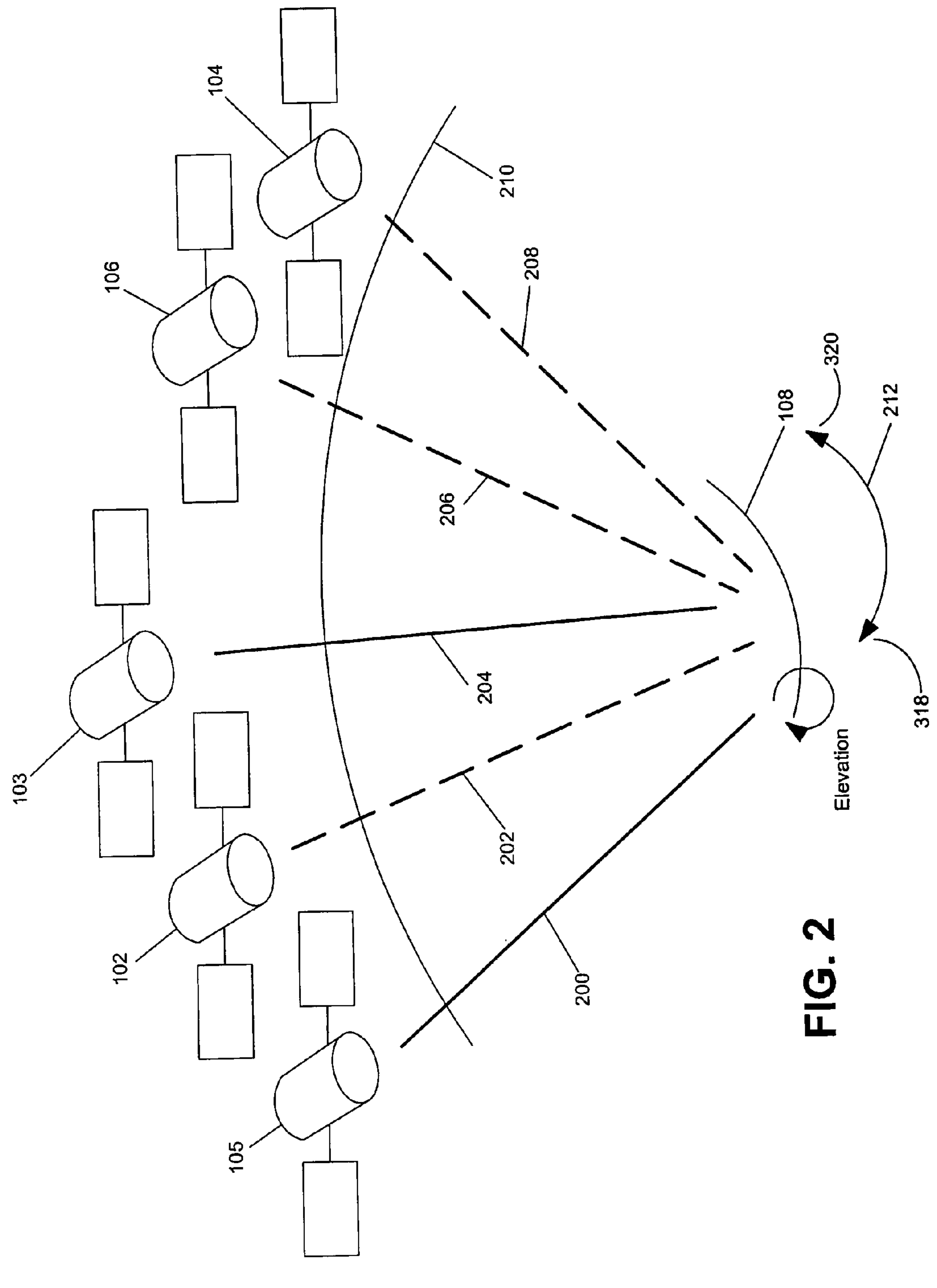
FIG. 2 illustrates an alignment in accordance with one or more embodiments of the present invention.

FIG. 2 illustrates an alignment in accordance with one or more embodiments of the present invention.

ODU 108 must receive signals 200-208, collectively referred to as downlink signals 120, on the reflector dish that is part of ODU 108. The reflector dish reflects downlink signals to feedhorns for reception, and on to other electronics for processing.

Signals 200 and 204, which are transmitted by satellites 105 and 103 respectively, are transmitted in the Ka-band of frequencies, typically at frequencies of 18.3-18.8 GHz and 19.7-20.2 GHz. These transmissions are shown as solid lines for signals 200 and 204. Signals 202, 206, and 208 are transmitted in the Ku-band of frequencies, typically at the 12.2-12.7 GHz range.

Typically, alignments are done with respect to the most sensitive feature of the alignment. In this case, the most sensitive alignment feature would be signals 200 and 204, because at their higher frequency of transmission, the losses and alignment errors for these signals 200 and 204 would be most affected by misalignment of ODU 108 with arc 210.

Azimuth, Elevation, and Tilt (Skew or Rotation)

Figure 3:
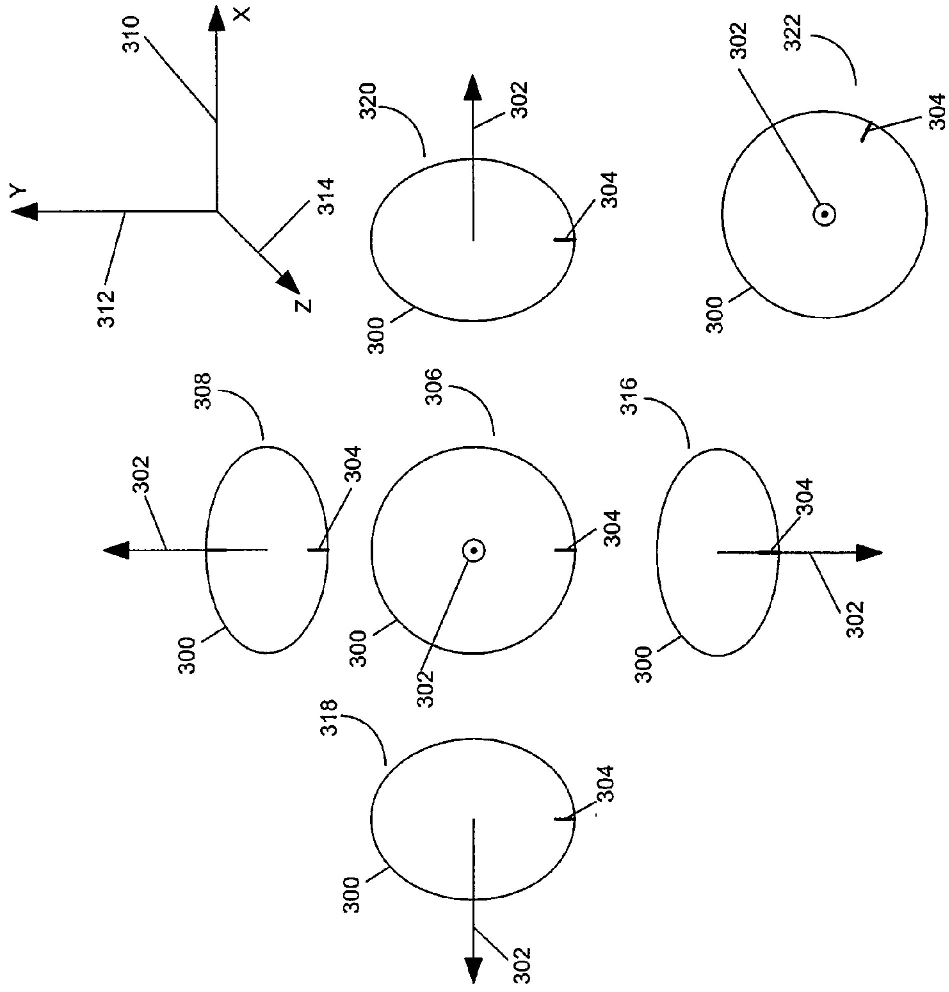
FIG. 3 illustrates azimuth, elevation, and rotational adjustments of an Outdoor Unit with respect to one or more embodiments of the present invention.

FIG. 3 illustrates azimuth, elevation, and rotational adjustments of an ODU with respect to one or more embodiments of the present invention.

Antenna reflector 300 is shown, with boresight 302 and rotational mark 304 illustrated. Although boresight 302 is shown substantially at the center of antenna reflector 300, boresight 302 can be at other locations without departing from the scope of the present invention.

As shown in configuration 306, reflector 300 is pointed directly out of the page, with boresight 302 showing the head of the arrow in standard notation. The boresight 302 is pointed directly at the viewer.

In configuration 308, reflector 300 is rotated around the x-axis 310, and is held constant with respect to y-axis 312 and z-axis 314. As such, reflector is tilted "up," e.g., away from the plane of the page, and, as such, boresight 302 points up. This is considered an increase in the elevation of reflector 300.

In configuration 316, reflector 300 is rotated in the opposite direction around the x-axis 310 with regard to the direction of rotation in configuration 308, and is again held constant with respect to y-axis 312 and z-axis 314. As such, reflector is tilted "down," e.g., away from the plane of the page, and, as such, boresight 302 points down. This is considered a decrease in the elevation of reflector 300.

In configuration 318, reflector 300 is rotated around the y-axis 312, and is held constant with respect to x-axis 310 and z-axis 314. As such, reflector is tilted "left," e.g., away from the plane of the page, and, as such, boresight 302 points left. This is considered an increase in the azimuth of reflector 300.

In configuration 316, reflector 320 is rotated in the opposite direction around the y-axis 312 with regard to the direction of rotation in configuration 308, and is again held constant with respect to x-axis 310 and z-axis 314. As such, reflector is tilted "right," e.g., away from the plane of the page, and, as such, boresight 302 points right. This is considered a decrease in the azimuth of reflector 300.

In configuration 322, reflector 300 is rotated around the z-axis 314, and is held constant with respect to x-axis 310 and y-axis 312. As such, reflector is rotated "counterclockwise," e.g., in the plane of the page and to the right, and, as such, rotational mark 304 is no longer at the bottom of reflector 300, but has moved to the right. This is considered an increase in the tilt (also called skew or rotation) of reflector 300.

To properly align reflector 300, and, as such, ODU 108 of which reflector 300 is a part, the reflector 300 must be pointed at the proper azimuth, elevation, and tilt to be able to receive signals from satellites 102-106.

Alignment

In a typical antenna installation, the installer does not know a priori the quantitative antenna performance that can be achieved when the installer maximizes the signal strength of the received signal reflected by reflector 300. Without a peak value as a reference, the installer does not know how close the alignment of a given reflector 300 is with respect to the peak signal strength, or how far the alignment is from the peak signal strength. As a result, the installer often leaves the installation at a less than optimal alignment, which may result in poorer performance of the ODU 108 under different weather conditions, e.g., rain fades, or other attenuation of signal transmission power.

The present invention allows for installers to use measurements of signal strength through azimuth and elevation passes, and the qualities of the transmitted signal, to predict the optimal signal strength of the transmitted signal, and maximize the received signal strength at ODU 108.

Transmit Antenna Pattern Modeling

Figure 4:
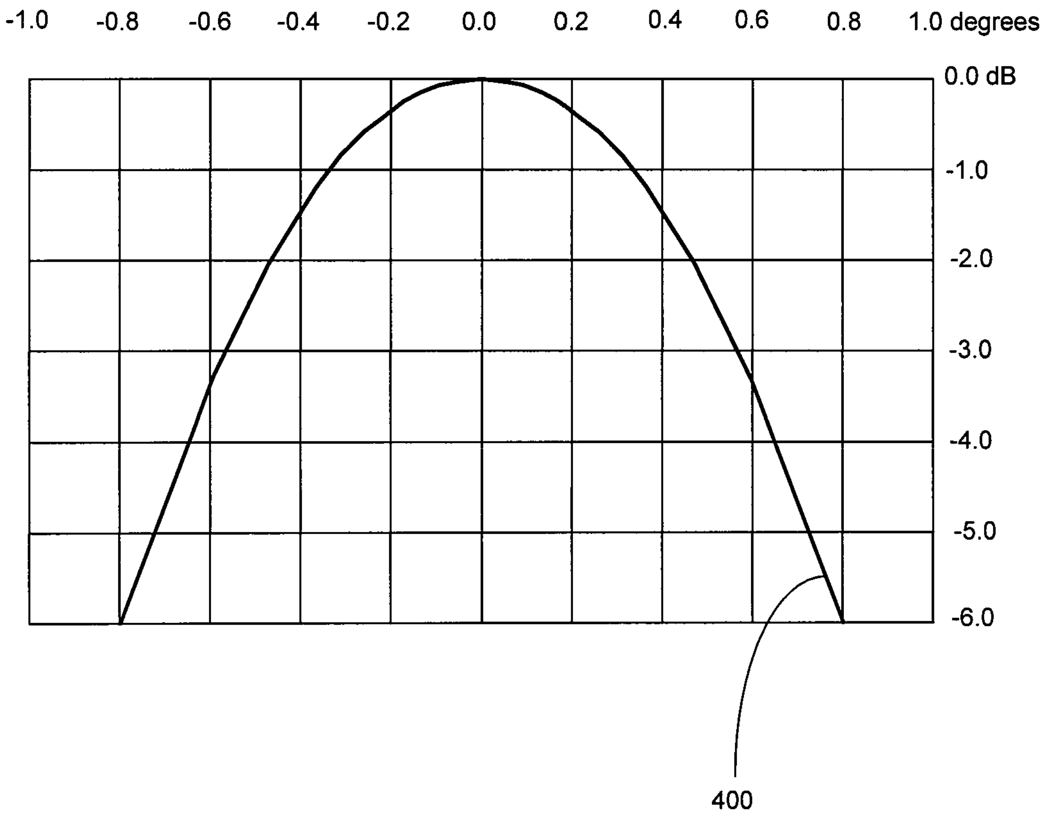
FIG. 4 illustrates a transmit antenna pattern in accordance with one or more embodiments of the present invention.

FIG. 4 illustrates an example transmit (or receive) antenna pattern in accordance with one or more embodiments of the present invention.

Antenna pattern 400 is shown on a graph with a 0 dB maximum peak at boresight. Pattern 400 can be modeled as a two-dimensional Gaussian structure in power, which is empirically accurate on ODU 108 for gains down to about −10 dB from the boresight of the ODU 108. Although actual patterns 400 may have a slight asymmetry depending on antenna design, the symmetrical Gaussian model is still accurate to approximately −6 dB, which allows for straightforward calculations to determine the boresight of a given ODU, which will give the maximum antenna performance.

Figure 5:
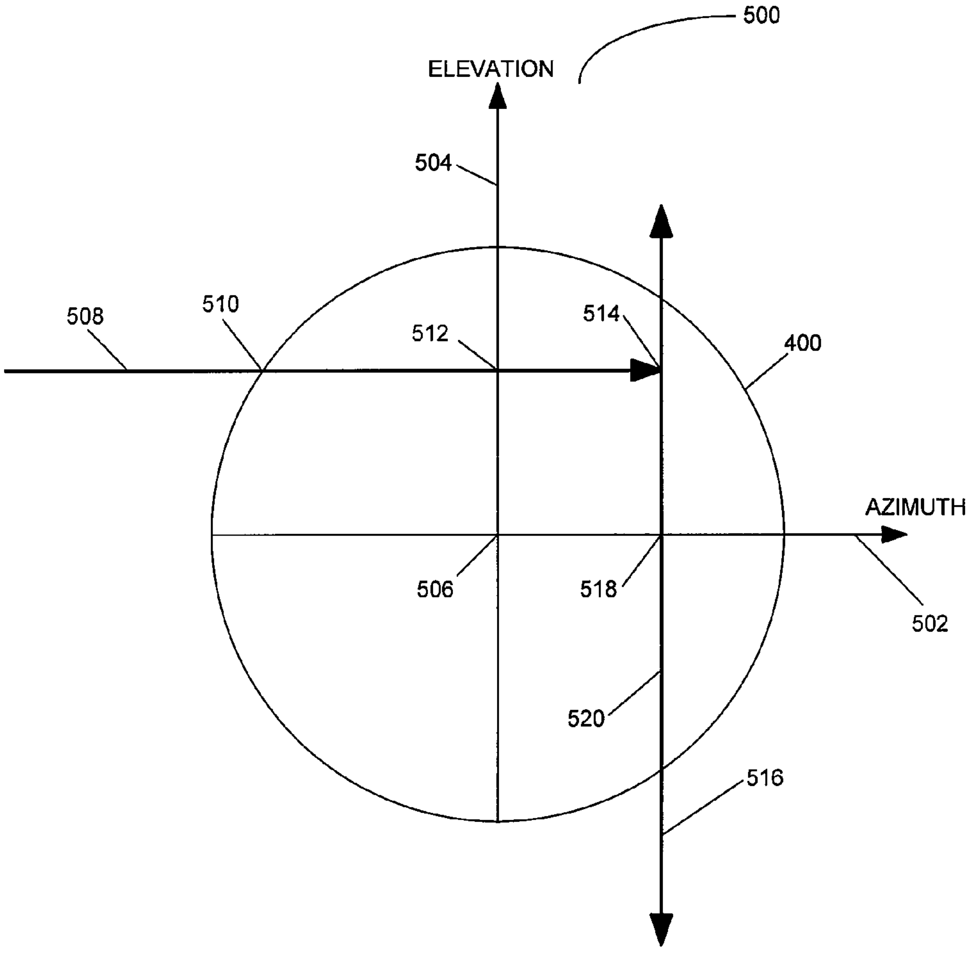
FIG. 5 illustrates azimuth and alignment cuts in accordance with one or more embodiments of the present invention.

FIG. 5 illustrates azimuth and alignment cuts in accordance with one or more embodiments of the present invention. This is typically done for Sat A 102 on either of its two polarizations, although any other satellite may also be used.

Typically a coarse alignment is performed prior to performing a fine alignment as described with respect to FIG. 5. The current invention entails a fine alignment of ODU 108 in accordance with the present invention.

Graph 500 illustrates a view of pattern 400 at a certain signal strength. For example, and not by way of limitation, pattern 400 shown in graph 500 can be at −6 dB from the peak signal strength of the received power. The azimuth axis 502 and elevation axis 504 are shown, and the intersection 506 of axes 502 and 504 is the peak signal strength of antenna pattern 400.

Once the tilt alignment is performed for reflector 300, an installer typically performs an azimuth alignment by sweeping the reflector 300 along line 508 from point 510, through point 512 and on to point 514. At point 512, an alignment meter will read and record the maximum signal strength for the azimuth line 508, known as the “local peak” or “azimuth peak” point 512. The alignment meter records the signal strength values, and indicates to the installer that the signal strength has risen and then fallen (once the alignment of reflector 300 has passed point 512), and typically continues on to a given strength below the recorded local peak point 512, which may be a −3 dB point, or some other given reduction in signal strength.

Stopping at point 514, the installer then typically performs an elevation alignment by sweeping the reflector along line 516. The installer moves the reflector 300 only in elevation, going through point 514, and toward point 518 and onward to point 520. The first point 512 is at the local peak on line 508. Likewise, the third point 518 is at the local peak on curve 516. The second point 514 is at a lower power than points 512 and 518 from the property of a 2D Guassian antenna pattern.

Through the alignment process described with respect to FIG. 5, either IRD 112 or a separate meter records the signal strength received by ODU 108 at points 512, 514, 518, and 520. The peak signal strength available to that given ODU 108, which is at point 506, can thus be calculated, and the distance (angular direction) that ODU 108/reflector 300 needs to be moved can also be calculated and reported to the installer such that ODU 108/reflector 300 can be moved to be aligned at point 506.

Gaussian Pattern Calculation

The gain value of the two-dimensional Gaussian antenna pattern can be expressed by an equation of a 2-dimensional normal distribution shape. Assuming that antenna boresight is at the origin of the coordinate system, the two-dimensional Gaussian pattern may be expressed as:

$$s(a,e) = G\exp\left(\frac{-a^2}{2\sigma_a^2}\right)\exp\left(\frac{-e^2}{2\sigma_e^2}\right)$$

where G is the assumed antenna gain at boresight, a is the off-boresight angle in azimuth, and e is the off-boresight angle in elevation. Note that $\sigma_a$ and $\sigma_e$ are the off-boresight angles along azimuth and elevation angles, respectively, where antenna gain will be reduced to exp(−0.5)=0.606 of the boresight gain.

s(0,0)=G at antenna boresight (point 506). The one-dimensional azimuth-cut Gaussian pattern at elevation angle $e_0$ is:

$$s(a,e_0) = G\exp\left(\frac{-a^2}{2\sigma_a^2}\right)\exp\left(\frac{-e_0^2}{2\sigma_e^2}\right)$$

Similarly, the one-dimensional elevation-cut Gaussian pattern at azimuth angle $a_0$ is:

$$s(a_0,e) = G\exp\left(\frac{-a_0^2}{2\sigma_a^2}\right)\exp\left(\frac{-e^2}{2\sigma_e^2}\right)$$

Since $a=a_0$ and $e=e_0$ at the cross-over point 514, $$s(pt514) = G\exp\left(\frac{-a_0^2}{2\sigma_a^2}\right)\exp\left(\frac{-e_0^2}{2\sigma_e^2}\right)$$

However, a=0 at point 512 and e=0 at point 518, so:

$$s(pt512) = G\exp\left(\frac{-e_0^2}{2\sigma_e^2}\right)$$

and $$s(pt518) = G\exp\left(\frac{-a_0^2}{2\sigma_a^2}\right)$$

The above three equations for at points 514, 516, and 518 may be solved for the three unknowns $\sigma_a$, $\sigma_e$, and G. In the special case when $\sigma_a=\sigma_e$, G may be calculated simply as follows:

$$G = \left(\frac{s(pt512)s(pt518)}{s(pt514)}\right)$$

In decibel values, $$G=S(pt512)+S(pt518)-S(pt514).$$

So, knowing the signal strength at points 512, 518, and 514, the gain G in power or decibels can be determined without ever having the reflector 300 point directly at point 506. This determination can be made by IRD 112 or by a separate meter connected to ODU 108/reflector 300. Further, the signal strength values at points 512, 514, and 518 can then be used to determine the angular offset (the values a and e described in the equations above) of the antenna at points 512, 514, and 518, as well as any other point that ODU 108/reflector 300 is pointed at. Thus, the installer can be instructed to move the antenna in certain directions and in certain amounts in both azimuth and elevation to point the ODU 108/reflector 300 at point 506.

The alignment process described with respect to FIG. 5, and that used in accordance with one or more embodiments of the present application, does not have to be performed at a specific speed or even at a constant speed. All that is required to calculate the peak strength at 506 is the relative powers and angles for the three points 512, 514 and 518. Further, the values required to perform the calculation of boresight point 506 can be obtained by converting the measured values through a table look-up. Note that $\sigma_a=\sigma_e=\sigma$ for a symmetric antenna pattern between azimuth and elevation in the above equations.

Meter Usage

Figure 6:
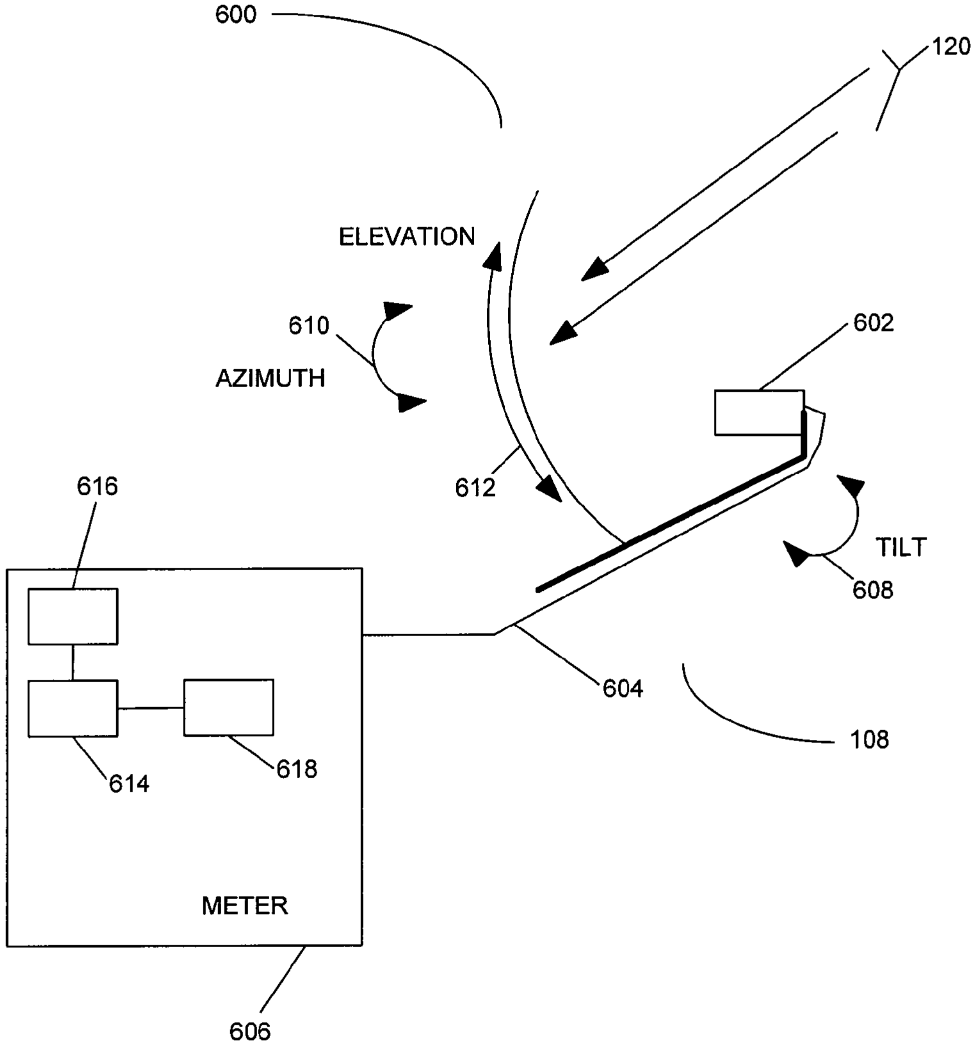
FIG. 6 is a block diagram in accordance with one or more embodiments of the present invention.

FIG. 6 is a block diagram in accordance with one or more embodiments of the present invention.

Diagram 600 shows ODU 108, which comprises reflector 300, LNB/multiswitch assembly 602, and cable 604. Cable 604 is typically coupled to IRD 112, but, in alignment diagram 600, is coupled to meter 606; however, IRD 112 can optionally perform the functions described herein instead of or in combination with meter 606.

Depending on the local longitude and latitude of the installation of a given ODU 108, the tilt 608, i.e., the rotation of the ODU 108/reflector 300, is set to a given angle. Then, the azimuth 610 sweep (i.e., the horizontal motion of the ODU 108/reflector 300) is performed, and meter 606 records, and, if desired, stores, signal strength measurements of the downlink signals 120 received at LNB/multiswitch assembly 602 throughout azimuth sweep 610. As described with respect to FIG. 5, during this azimuth 610 sweep of ODU 108/reflector 300, points 510, 512, and 514 will be encountered.

Once point 514 is encountered which may be set by the meter through a flexible criterion, meter 606 typically informs the installer via a visual or audio indication that the azimuth sweep is completed. This can be done via a tone, light, or signal strength meter, or any other indication that point 514 has been reached. The installer then typically stops moving the ODU 108 in azimuth and then moves the ODU 108 in elevation, by performing elevation sweep 612. Points 514, 518, and 520 are encountered during elevation sweep 612. Again, meter 606 informs the installer that point 520 has been reached.

Meter 606 can then be used to guide the installer to boresight the ODU 108/reflector 300 on point 506 in a number of ways. One possible embodiment is to have the installer return the ODU 108 to point 518, which is the maximum signal strength in elevation, and then move the antenna to the maximum point 506 by moving ODU 108 along the azimuth line 502 that intersects points 506 and 518. Another possible embodiment of the present invention is to have the meter 606 calculate the angular distance and the maximum possible signal strength based on points 512, 514, and 518, and inform the installer to move the ODU 108 in azimuth and elevation a certain number of degrees to thus point the ODU 108 at point 506.

Within meter 600, the signal strengths of signals 120, which can come from one or more of the satellites in the constellation, travel on cable 604 are processed and/or measured by processor 614, and the signal strengths are stored in memory 616. Processor 614 then processes the signals and generates the instructions for the installer to follow. Display/indicator 618 is used to indicate to the installer which step to execute next, or to indicate the signal strengths to the installer to perform the alignment as described above.

Once the first attempt is made at locating point 506 is completed, the meter 606 can also optionally have the installer move the ODU 108 a predetermined amount in azimuth (in one or both directions away from point 506) and in elevation (again, in one or both directions away from point 506) to ensure that the ODU 108 is boresighted on point 506. If the calculations performed by meter 606 prior to this step were somehow in error, this final alignment step will catch those errors and properly align ODU 108 with point 506. The alignment diagram 600 can be used in any order, e.g., elevation sweep 612 can be performed before azimuth sweep 610, etc., without departing from the scope of the present invention. Further, a coarse alignment can be performed prior to the sweeps 608-612 if desired.

Scintillation

The frequency that the meter 606 or IRD 112 reads is important, because the meter 606 must sample the frequency and store the power often enough such that the meter can capture the signal strength measurements. If the measurements made by meter 606 or IRD 112 are made in the Ka-band spectrum, such spectrum is subject to scintillation, which is a fluctuation of the power because of atmospheric effects, even when the ODU 108 is not moved. The meter 606 and/or IRD 112 can counteract scintillation effects by performing a time-average of the power measurements, or taking a rapid burst of measurements when the rate of change of the power is approaching zero, or take multiple measurements at a given point in time (similar to over sampling the signal) to arrive at an average data point to be stored in the meter 606/IRD 112.

Process Chart

Figure 7:
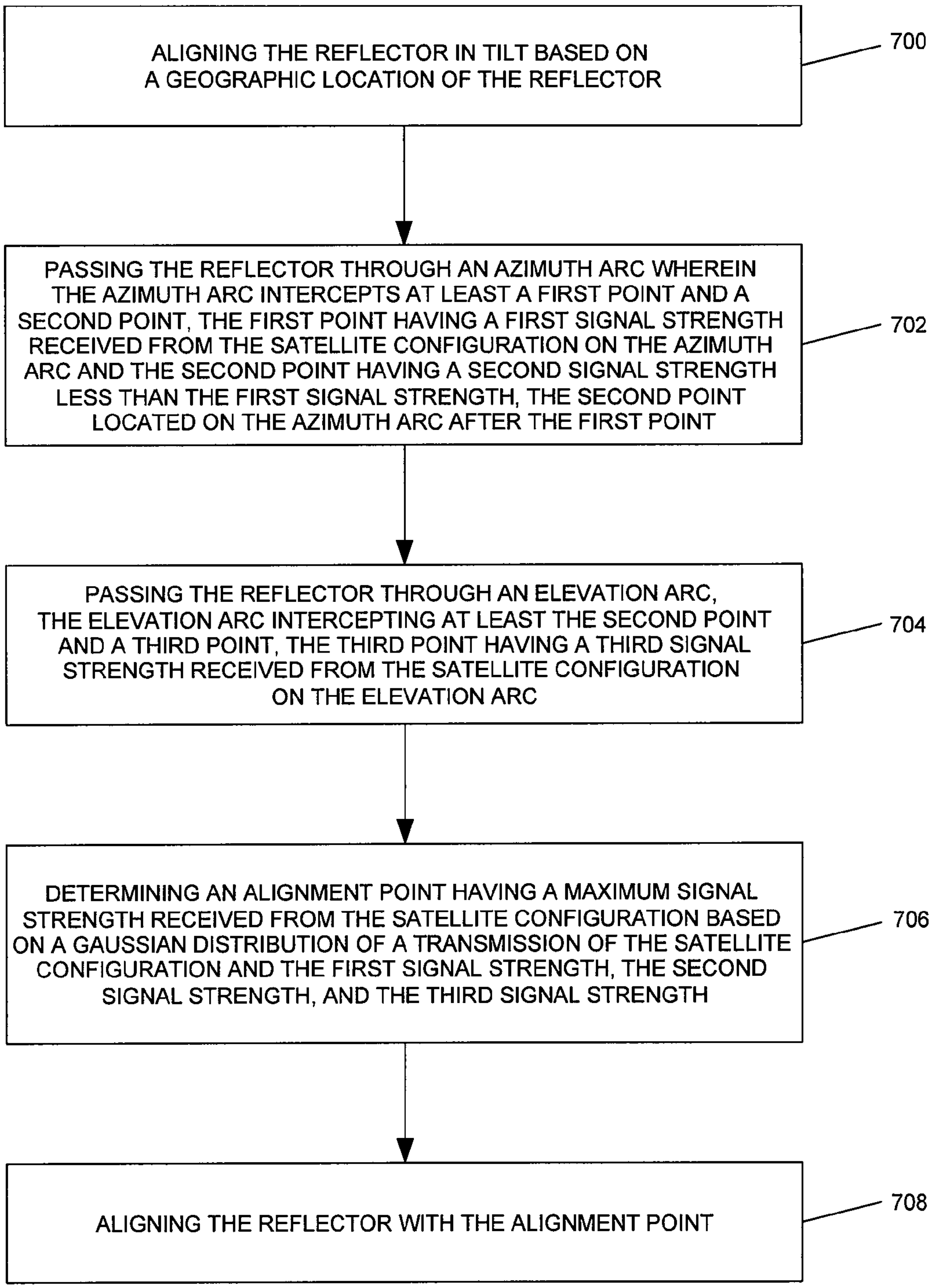
FIG. 7 illustrates a process chart in accordance with one or more embodiments of the present invention.

FIG. 7 illustrates a process chart in accordance with one or more embodiments of the present invention.

Box 700 illustrates aligning the reflector in tilt based on a geographic location of the reflector.

Box 702 illustrates passing the reflector through an azimuth arc wherein the azimuth arc intercepts at least a first point and a second point, the first point having a first signal strength received from the satellite configuration on the azimuth arc and the second point having a second signal strength less than the first signal strength, the second point located on the azimuth arc after the first point.

Box 704 illustrates passing the reflector through an elevation arc, the elevation arc intercepting at least the second point and a third point, the third point having a third signal strength received from the satellite configuration on the elevation arc.

Box 706 illustrates determining an alignment point having a maximum signal strength received from the satellite configuration based on a Gaussian antenna pattern of a reception of the satellite signal and the first signal strength, the second signal strength, and the third signal strength.

Box 708 illustrates aligning the reflector with the alignment point.

CONCLUSION

In summary, the present invention comprises one or more embodiments of methods, apparatuses, and systems for aligning an antenna reflector with satellites in a satellite configuration.

A method for aligning a reflector of an antenna with a satellite configuration in accordance with one or more embodiments of the present invention comprises aligning the reflector in tilt based on a geographic location of the reflector; passing the reflector through an azimuth arc wherein the azimuth arc intercepts at least a first point and a second point, the first point having a first signal strength received from the satellite configuration on the azimuth arc and the second point having a second signal strength less than the first signal strength, the second point located on the azimuth arc after the first point, passing the reflector through an elevation arc, the elevation arc intercepting at least the second point and a third point, the third point having a third signal strength received from the satellite configuration on the elevation arc, determining an alignment point having a maximum signal strength received from the satellite configuration based on a Gaussian antenna pattern of a reception of the satellite signal and the first signal strength, the second signal strength, and the third signal strength, and aligning the reflector with the alignment point.

Such a method may further optionally comprise performing a coarse alignment, verifying the reflector is aligned with the alignment point, determining the alignment point being performed by a signal strength meter, determining the alignment point being done by a receiver, the transmission being determined from a plurality of orbital slots, and the first signal strength, the second signal strength, and the third signal strength are measured using a time-average to counteract scintillation.

An alignment system in accordance with one or more embodiments of the present invention comprises an antenna having a reflector, and a meter, the meter being coupled to the antenna, wherein the reflector is aligned in tilt based on a geographic location of the reflector, and the meter provides indications of signal strengths of at least a first point and a second point lying on an azimuth arc of the reflector and the second point and a third point lying on an elevation arc of the reflector, wherein an alignment point is determined by the meter based on a Gaussian antenna pattern of a reception of a satellite signal and the signal strengths measured at the first point, the second point, and the third point.

Such an alignment system may further optionally comprise the reflector being coarsely aligned prior to the measurements made at the first point, aligning the reflector with the alignment point, the meter being integrated with a receiver, the alignment point being determined by the meter and a separate receiver, the transmission being determined from a plurality of orbital slots, and the signal strengths being measured using a time-average to counteract scintillation.

A meter in accordance with one or more embodiments of the present invention is used in aligning a reflector in a satellite-based communications system, and comprises a memory, a processor, coupled to the memory, and an indicator, coupled to the processor, wherein the memory stores a plurality of signal strengths from at least a first point, a second point, and a third point, the first point having a first signal strength received from the satellite-based communications system along an azimuth arc of the reflector, the second point having a second signal strength less than the first signal strength, the second point located on the azimuth arc after the first point, the third point having a third signal strength received from the satellite-based communications system along an elevation arc of the reflector, wherein the meter determines an alignment point having a maximum signal strength received from the satellite-based communications system based on a Gaussian antenna pattern of a reception of the satellite signal and the first signal strength, the second signal strength, and the third signal strength.

It is intended that the scope of the invention be limited not by this detailed description, but rather by the claims appended hereto and the equivalents thereof. The above specification, examples and data provide a complete description of the manufacture and use of the composition of the invention. Since many embodiments of the invention can be made without departing from the spirit and scope of the invention, the invention resides in the claims hereinafter appended and the equivalents thereof.

What is claimed is:

1. A method for aligning a reflector of an antenna with a satellite configuration, comprising:

aligning the reflector in tilt based on a geographic location of the reflector;

passing the reflector through an azimuth arc wherein the azimuth arc intercepts at least a first point and a second point, the first point having a first signal strength received from the satellite configuration on the azimuth arc and the second point having a second signal strength less than the first signal strength, the second point located on the azimuth arc after the first point;

passing the reflector through an elevation arc after passing the reflector through the azimuth arc, the elevation arc intercepting at least the second point and a third point, the third point having a third signal strength received from the satellite configuration on the elevation arc;

determining an alignment point having a maximum signal strength received from the satellite configuration based on a Gaussian antenna pattern of a reception of the satellite signal and the first signal strength, the second signal strength, and the third signal strength; and aligning the reflector with the alignment point.

2. The method of claim 1, further comprising performing a coarse alignment by pointing the reflector to an approximate satellite configuration.

3. The method of claim 1, further comprising verifying the reflector is aligned with the alignment point by measuring a signal strength at the alignment point.

4. The method of claim 1, wherein determining the alignment point is performed by a signal strength meter.

5. The method of claim 1, wherein determining the alignment point is done by a receiver.

6. The method of claim 1, wherein the alignment point is determined from a plurality of orbital slots.

7. The method of claim 1, wherein the first signal strength, the second signal strength, and the third signal strength are measured using a time-average of multiple samples of the first signal strength, second signal strength, and third signal strength to counteract scintillation.

8. A meter for use in aligning a reflector in a satellite-based communications system, comprising:

a memory;

a processor, coupled to the memory; and an indicator, coupled to the processor, wherein the memory stores a plurality of signal strengths from at least a first point, a second point, and a third point, the first point having a first signal strength received from the satellite-based communications system along an azimuth arc of the reflector, the second point having a second signal strength less than the first signal strength, the second point located on the azimuth arc after the first point, and after passing the reflector through the azimuth arc, the third point having a third signal strength received from the satellite-based communications system being shown on the indicator, the second point and the third point being along an elevation arc of the reflector;

wherein the meter determines an alignment point having a maximum signal strength received from the satellite-based communications system based on a Gaussian antenna pattern of a reception of the satellite signal and the first signal strength, the second signal strength, and the third signal strength.

9. The meter of claim 8, wherein the alignment point is determined from a plurality of orbital slots.

10. The meter of claim 8, wherein the first signal strength, the second signal strength, and the third signal strength are measured using a time-average of multiple samples of at least one of the first signal strength, the second signal strength, and the third signal strength to counteract scintillation.

* * * * *